US008647935B2

(12) United States Patent
Anderson et al.

(10) Patent No.: US 8,647,935 B2
(45) Date of Patent: Feb. 11, 2014

(54) BURIED OXIDATION FOR ENHANCED MOBILITY

(75) Inventors: Brent A. Anderson, Jericho, VT (US); Edward J. Nowak, Essex Junction, VT (US); Andreas Scholze, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 651 days.

(21) Appl. No.: 12/971,199

(22) Filed: Dec. 17, 2010

(65) Prior Publication Data

US 2012/0153353 A1 Jun. 21, 2012

(51) Int. Cl.
*H01L 21/00* (2006.01)
*H01L 21/84* (2006.01)

(52) U.S. Cl.
USPC ........... 438/165; 438/164; 438/221; 438/296; 438/405; 438/424; 257/192; 257/742; 257/E29.255; 257/E21.409

(58) Field of Classification Search
USPC ......... 438/164, 165, 221, 296, 299, 405, 424, 438/752, 933, FOR. 134, FOR. 291, 438/FOR. 292, FOR. 398; 257/192, 616, 257/742, E29.255, E21.409
See application file for complete search history.

(56) References Cited

U.S. PATENT DOCUMENTS

| 6,884,667 | B1 | 4/2005 | Doris et al. | |
| 7,550,364 | B2 | 6/2009 | Chidambarrao et al. | |
| 7,585,711 | B2 | 9/2009 | Chen et al. | |
| 7,659,581 | B2 | 2/2010 | Chidambarrao et al. | |
| 7,696,537 | B2 | 4/2010 | Kohyama | |
| 2006/0231892 | A1 | 10/2006 | Furukawa et al. | |
| 2007/0117296 | A1 | 5/2007 | Giles et al. | |
| 2007/0122965 | A1* | 5/2007 | Chidambarrao et al. | 438/219 |
| 2008/0203427 | A1 | 8/2008 | Mowry et al. | |
| 2009/0101971 | A1* | 4/2009 | Kujirai | 257/330 |
| 2010/0015814 | A1 | 1/2010 | Chen et al. | |
| 2010/0105188 | A1* | 4/2010 | Moens et al. | 438/427 |
| 2011/0079836 | A1* | 4/2011 | Lin | 257/306 |
| 2013/0015515 | A1* | 1/2013 | Anderson et al. | 257/302 |

FOREIGN PATENT DOCUMENTS

JP 2008218899 9/2008

* cited by examiner

*Primary Examiner* — N Drew Richards
*Assistant Examiner* — Joannie A Garcia
(74) *Attorney, Agent, or Firm* — Gibb & Riley, LLC; David A. Cain, Esq.

(57) ABSTRACT

A method patterns at least one pair of openings through a protective layer and into a substrate. The openings are positioned on opposite sides of a channel region of the substrate. The method forms sidewall spacers along the sidewalls of the openings and removes additional substrate material from the bottom of the openings. The material removal process creates an extended bottom within the openings. The method forms a first strain producing material within the extended bottom of the openings. The method removes the sidewall spacers and forms a second material within the remainder of the openings between the first strain producing material and the top of the openings. The method removes the protective layer and forms a gate dielectric and a gate conductor on the horizontal surface on the substrate adjacent the channel region. The second material comprises source and drain regions.

17 Claims, 5 Drawing Sheets

BURIED OXIDATION FOR ENHANCED MOBILITY

BACKGROUND

The present invention relates to integrated circuit devices, and more specifically, to a method and structure that utilizes oxides below source and drain regions of transistors to increase compressive strain within the channel region of such transistors.

As integrated circuit devices such as transistors are reduced in size and increased in density, some advantages can be obtained by providing physical stress to the channel region of such transistors. Various previous structures and methods induced stress into the channel region; however, such conventional processes are costly and produce a limited amount of stress level.

SUMMARY

One exemplary embodiment herein is a method that forms an integrated circuit device. This method forms a protective layer over a horizontal surface of a substrate. The horizontal surface runs in a horizontal direction. The method patterns at least one pair of openings through the protective layer and into the substrate. The openings each have a top adjacent the protective layer, a bottom within the substrate, and sidewalls that run from the top to the bottom. The openings run in a vertical direction from the top to the bottom. The vertical direction is approximately perpendicular to the horizontal direction. The openings are positioned on opposite sides of a channel region of the substrate. The method forms sidewall spacers along the sidewalls of the openings and performs a material removal process to remove additional substrate material from the bottom of the openings. The material removal process extends the bottom of the openings deeper into the substrate in the vertical direction, and extends the sidewalls outward into the substrate in the horizontal direction at the bottom of the openings to create an extended bottom within the openings. The method forms a first strain producing material within the extended bottom of the openings. Next, the method removes the sidewall spacers and forms a second material within the remainder of the openings between the first strain producing material and the top of the openings. The method removes the protective layer and forms a gate dielectric and a gate conductor on the horizontal surface on the substrate adjacent the channel region. The second material comprises source and drain regions.

Another exemplary embodiment herein is a method that forms an integrated circuit device. This method forms a protective layer over a horizontal surface of a substrate. The horizontal surface runs in a horizontal direction. The substrate also includes an enhancement layer that runs in the horizontal direction. The enhancement layer increases the rate of the material removal process and/or the rate of formation of the first strain producing material. The method patterns at least one pair of openings through the protective layer and into the substrate. The openings each have a top adjacent the protective layer, a bottom within the substrate located at the enhancement layer, and sidewalls that run from the top to the bottom. The openings run in a vertical direction from the top to the bottom. The vertical direction is approximately perpendicular to the horizontal direction. The openings are positioned on opposite sides of a channel region of the substrate. The method forms sidewall spacers along the sidewalls of the openings and performs a material removal process to remove additional substrate material from the bottom of the openings. The material removal process extends the bottom of the openings deeper into the substrate and the enhancement layer in the vertical direction, and extends the sidewalls outward into the substrate and the enhancement layer in the horizontal direction at the bottom of the openings to create an extended bottom within the openings. The method forms a first strain producing material within the extended bottom of the openings. Next, the method removes the sidewall spacers and forms a second material within the remainder of the openings between the first strain producing material and the top of the openings. The method removes the protective layer and forms a gate dielectric and a gate conductor on the horizontal surface on the substrate adjacent the channel region. The second material comprises source and drain regions.

An integrated circuit device embodiment herein comprises a substrate having a horizontal surface that runs in a horizontal direction. The substrate comprises a channel region that is adjacent the horizontal surface. At least one pair of openings extend into the substrate. The openings are positioned on opposite sides of the channel region of the substrate. The openings each have a top adjacent the horizontal surface, a bottom within the substrate, and sidewalls that run from the top to the bottom. The openings run in a vertical direction from the top to the bottom. The vertical direction is approximately perpendicular to the horizontal direction. The openings include an extended bottom extending the bottom of the openings deeper into the substrate in the vertical direction, and extending the sidewalls outward into the substrate in the horizontal direction at the bottom of the openings. A first strain producing material is within the extended bottom of the openings. A second material is within the remainder of the openings between the first strain producing material and the top of the openings. A gate dielectric and a gate conductor are on the horizontal surface on the substrate adjacent the channel region. The second material comprises source and drain regions and forms a transistor with the channel region and the gate conductor.

Another integrated circuit device embodiment herein comprises a substrate having a horizontal surface that runs in a horizontal direction. The substrate comprises an enhancement layer that runs in the horizontal direction, and a channel region that is adjacent the horizontal surface. At least one pair of openings extend into the substrate. The openings are positioned on opposite sides of the channel region of the substrate. The openings each have a top adjacent the horizontal surface, a bottom within the substrate located at the enhancement layer, and sidewalls that run from the top to the bottom. The openings run in a vertical direction from the top to the bottom. The vertical direction is approximately perpendicular to the horizontal direction. The openings include an extended bottom extending the bottom of the openings deeper into the substrate and the enhancement layer in the vertical direction, and extending the sidewalls outward into the substrate and the enhancement layer in the horizontal direction at the bottom of the openings. A first strain producing material is within the extended bottom of the openings. A second material is within the remainder of the openings between the first strain producing material and the top of the openings. A gate dielectric and a gate conductor are on the horizontal surface on the substrate adjacent the channel region. The second material comprises source and drain regions and forms a transistor with the channel region and the gate conductor.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

As mentioned above, some advantages can be obtained by providing physical stress to the channel region of transistors. The embodiments herein utilize oxide stressing regions below the source and drain regions of transistors to provide additional stress on the channel region of a transistor in a process that has lower costs and produces higher stress levels when compared with conventional methods and devices.

Figure 1:
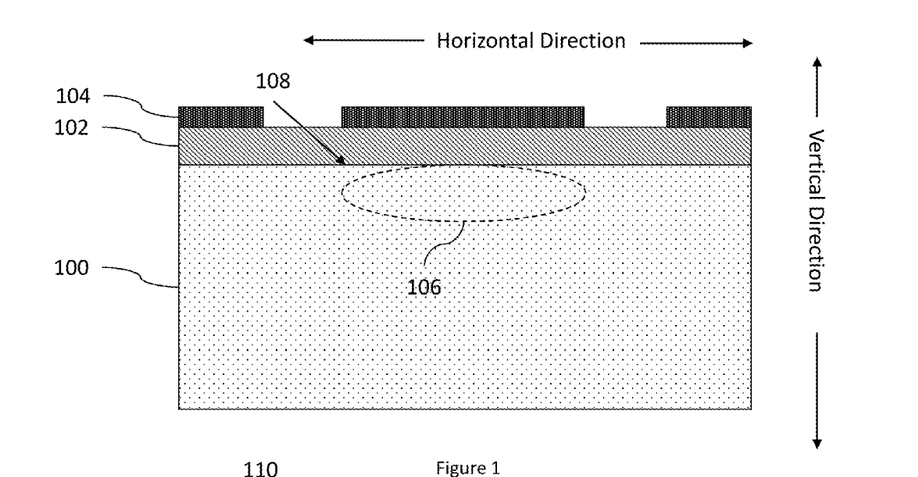
FIG. 1 is a side view schematic diagram of a device according to embodiments herein.

FIGS. 1-7 illustrate one embodiment that forms such oxide stressing regions 124. More specifically, as illustrated in FIG. 1, this exemplary embodiment begins with a substrate 100 that includes at least one semiconductor channel region 106.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures, etc. The "shallow trench isolation" (STI) structures are well-known to those ordinarily skilled in the art and are generally formed by patterning openings/trenches within the substrate and growing or filling the openings with a highly insulating material (this allows different active areas of the substrate to be electrically isolated from one another).

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

As shown in FIG. 1, this exemplary method forms a protective layer 102 (or a hardmask) over a horizontal surface 108 of the substrate 100. The horizontal surface 108 runs in an arbitrarily designated "horizontal" direction as shown in FIG. 1.

Such a hardmask 102 can be formed of any suitable material, whether now known or developed in the future, such as a metal or organic hardmask, that has a hardness greater than the substrate and insulator materials used in the remainder of the structure.

The method patterns at least one pair of openings 110 through the protective layer 102 and into the substrate 100 using, for example, a photoresist 104. When patterning any material herein, the material to be patterned can be grown or deposited in any known manner and a patterning layer (such as an organic photoresist 104) can be formed over the material 102. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

Figure 2:
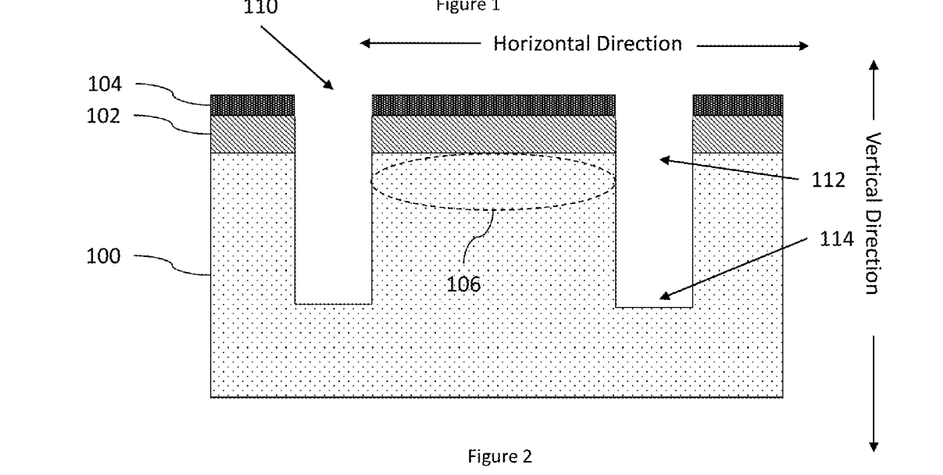
FIG. 2 is a side view schematic diagram of a device according to embodiments herein.

The openings 110 thus formed each have a top 112 adjacent the protective layer 102, a bottom 114 within the substrate 100, and sidewalls that run from the top 112 to the bottom 114, as shown in FIG. 2. The openings 110 run in an arbitrarily designated "vertical" direction from the top 112 to the bottom 114. The vertical direction is approximately perpendicular to the horizontal direction, as shown in the drawings. As shown, the openings 110 are positioned on opposite sides of a channel region 106 of the substrate 100.

Figure 3:
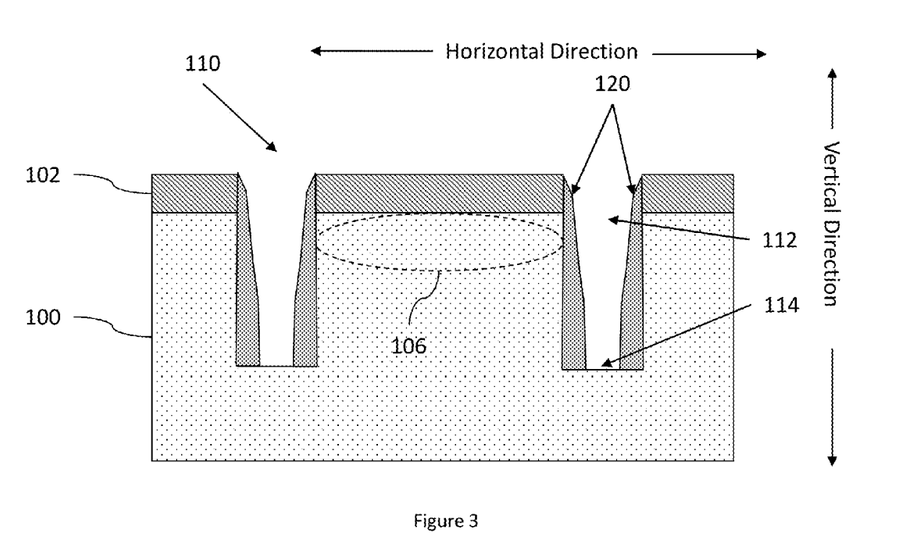
FIG. 3 is a side view schematic diagram of a device according to embodiments herein.

FIG. 3 illustrates that the method forms sidewall spacers 120 along the sidewalls of the openings 110.

For purposes herein, "sidewall spacers" are structures that are well-known to those ordinarily skilled in the art and are generally formed by depositing or growing a conformal insulating layer (such as any of the insulators mentioned herein) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

Figure 4:
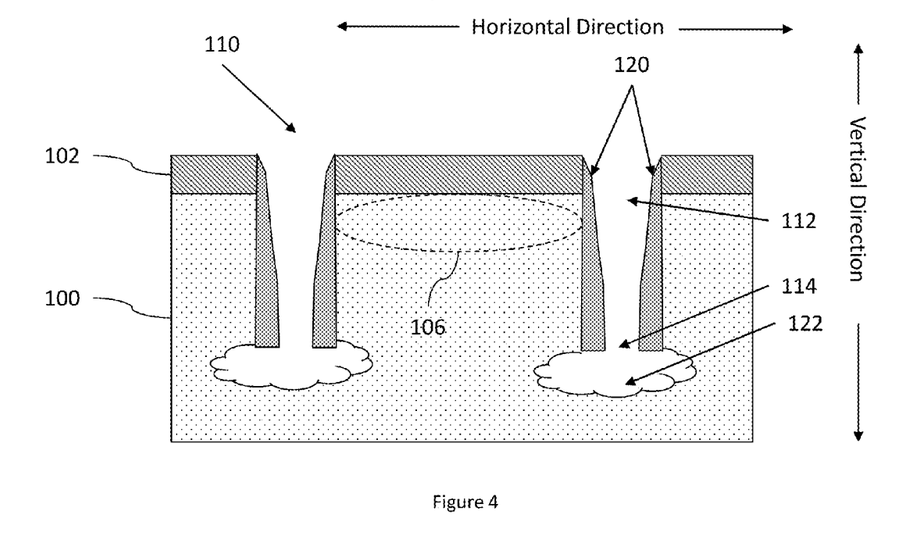
FIG. 4 is a side view schematic diagram of a device according to embodiments herein.

In FIG. 4, the method performs a material removal process (such as any of the material removal processes mentioned herein) to remove additional substrate 100 material from the bottom 114 of the openings 110. As shown in FIG. 4, the material removal process extends the bottom 114 of the openings 110 deeper into the substrate 100 in the vertical direction, and extends the sidewalls outward into the substrate 100 in the horizontal direction at the bottom 114 of the openings 110 to create an extended bottom 122 within the openings 110.

Figure 5:
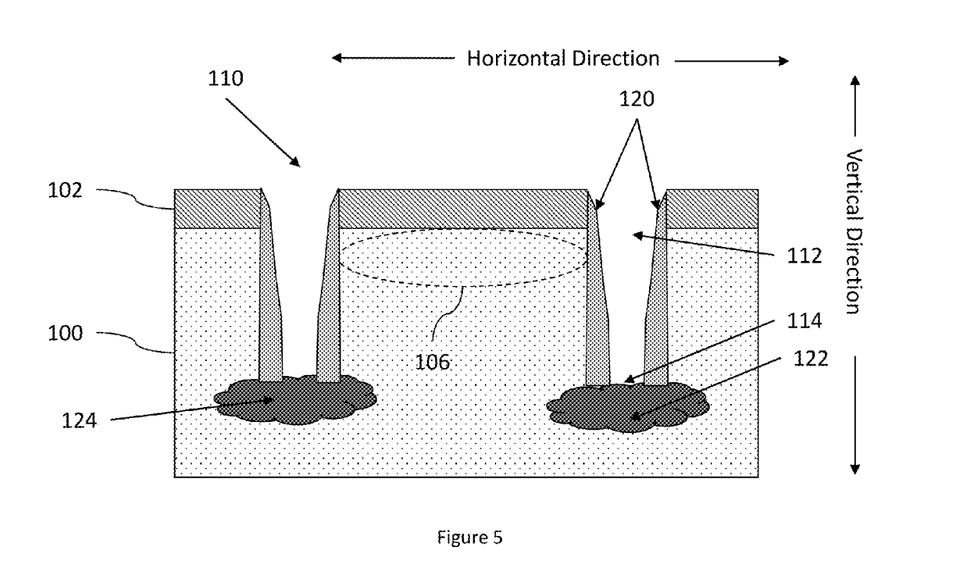
FIG. 5 is a side view schematic diagram of a device according to embodiments herein.

As illustrated in FIG. 5, the method forms an arbitrarily designated "first" strain producing material 124 within the extended bottom 122 of the openings 110. The first strain producing material 124 comprises any known straining materials, such as an oxide, silicon dioxide, Silicon Germanium Oxide, etc.

Figure 6:
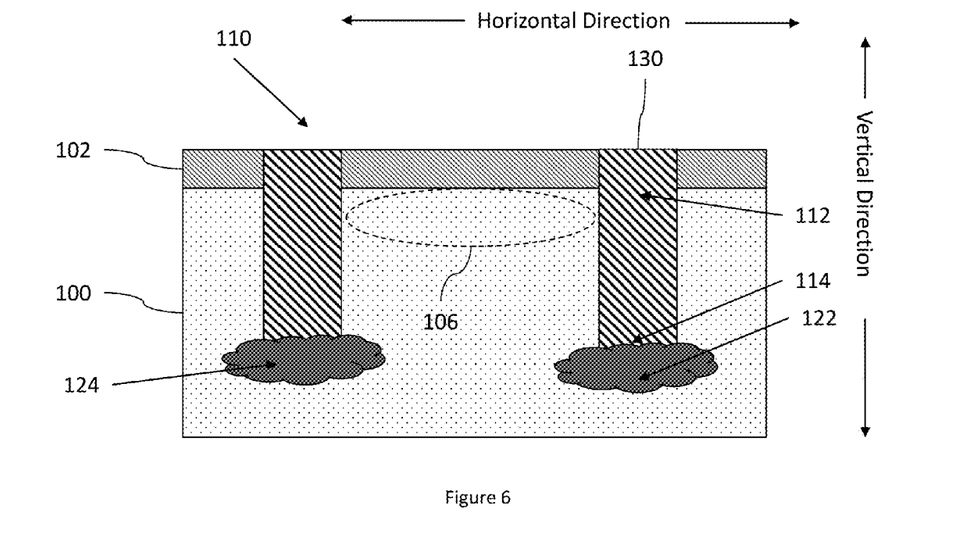
FIG. 6 is a side view schematic diagram of a device according to embodiments herein.

Next, as shown in FIG. 6, the method removes the sidewall spacers 120 (again using any appropriate selective material removal process). Following this, as also shown in FIG. 6, the method forms an arbitrarily designated "second" material 130 within the remainder of the openings 110 between the first strain producing material 124 and the top 112 of the openings 110. The second material 130 comprises a conductor, such as silicon germanium that can have straining characteristics.

The first strain producing material 124 expands to create compressive stress within the channel region 106. This strain producing capability of the first strain producing material 124 helps increase the amount of strain produced upon the channel region 106. Further, the amount of strain that is generated can be tailored by using different materials within the first strain producing material 124.

Figure 7:
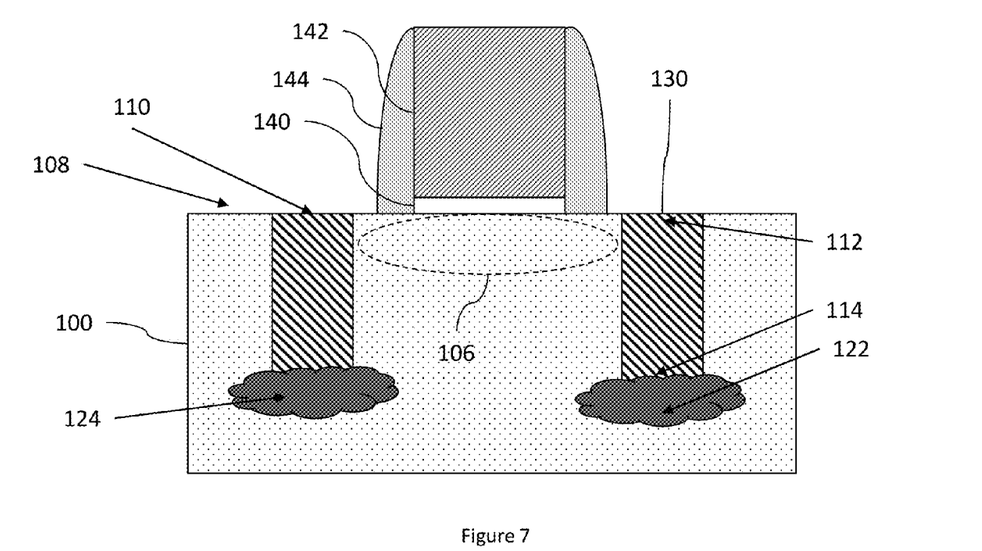
FIG. 7 is a side view schematic diagram of a device according to embodiments herein.

As shown in FIG. 7, any conventional planarization process such as chemical mechanical polishing (CMP) can be used to remove the protective layer 102 and return the horizontal surface 108 of the substrate 100 to a planar condition. After this, conventional patterning and sidewall formation processes (such as those discussed herein) are utilized to form a gate dielectric 140, a gate conductor 142, and sidewall spacers 144 on the horizontal surface 108 on the substrate 100 adjacent the channel region 106. The second material 130 comprises source and drain regions and form a transistor with the channel region 106 and the gate conductor 142.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate dielectric" (which is an insulator) and current/voltage within the gate changes the conductivity of the channel region of the transistor.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region. The embodiments herein are applicable to both types of transistors.

Figure 8:
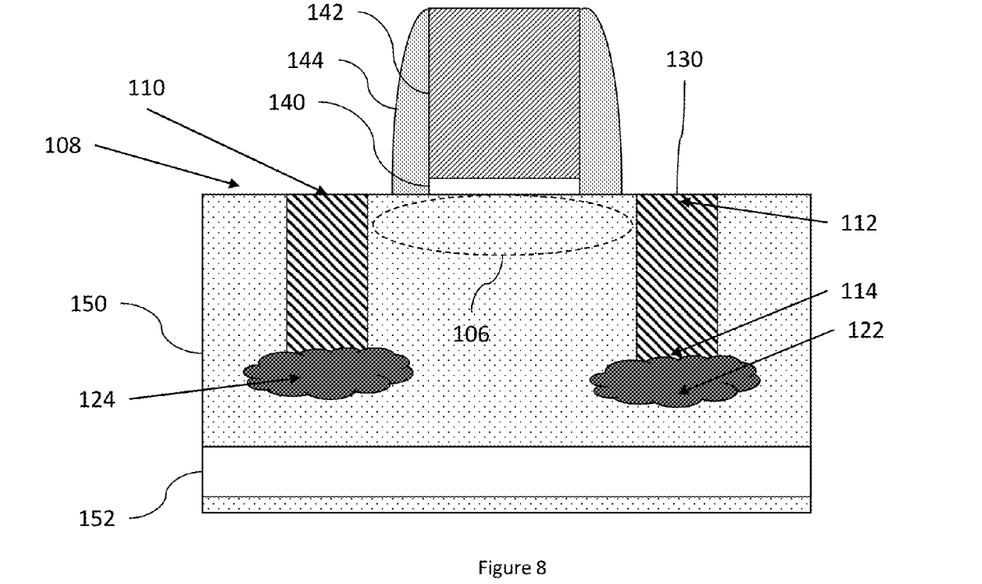
FIG. 8 is a side view schematic diagram of a device according to embodiments herein.

As shown in FIG. 8, the foregoing process steps can be performed with a different type of substrate 150 that includes an insulator layer 152 that is sometimes commonly referred to as a buried oxide layer. In such a situation, the substrate 150 is often referred to as a silicon-on-insulator (SOI) substrate. The same processing steps discussed above are performed; however, none of the processing steps impinge upon or disturb the buried oxide layer 152.

Figure 9:
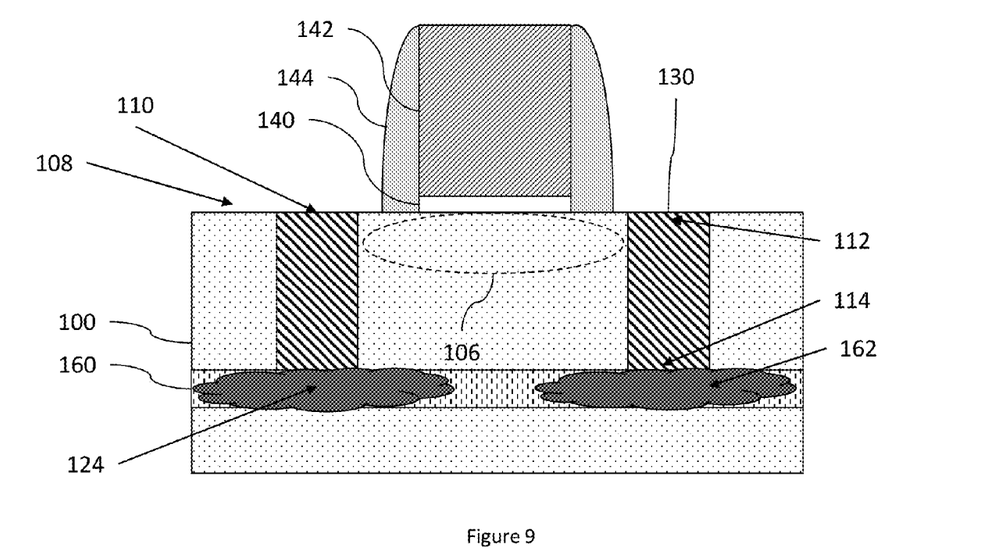
FIG. 9 is a side view schematic diagram of a device according to embodiments herein.
Figure 10:
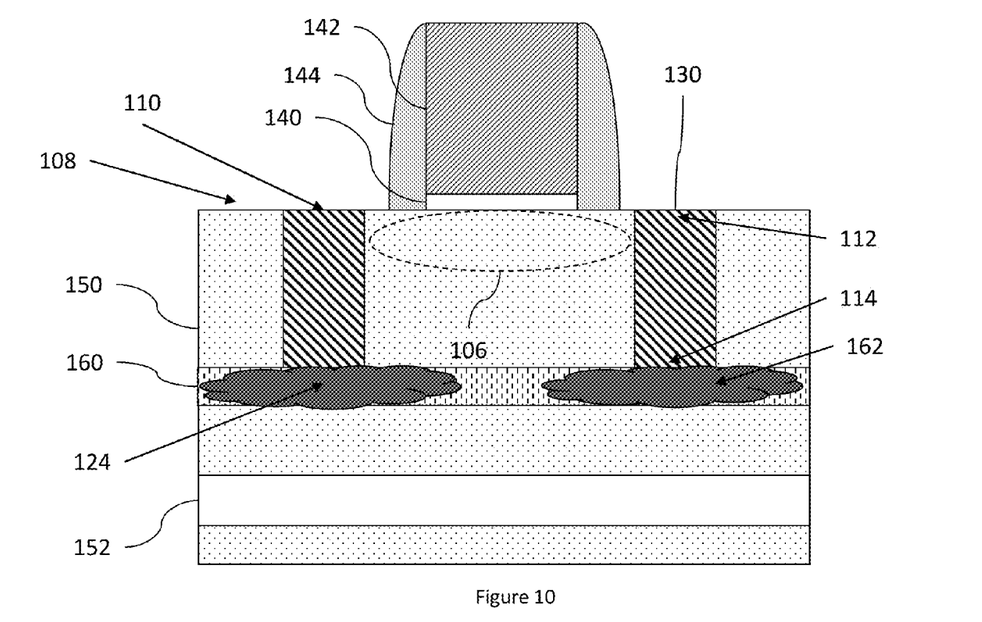
FIG. 10 is a side view schematic diagram of a device according to embodiments herein.

In other embodiment shown in FIGS. 9-10, the substrate 150 may also include an "enhancement" layer 160 that runs in the horizontal direction. The enhancement layer 160 is specifically designed to increase the rate of the material removal process and/or the rate of formation of the first strain producing material 124. For example, the enhancement layer 160 can comprise Silicon Germanium, Arsenic Doped Silicon, etc.

The extended bottom of the opening 110 is identified as item 162 in FIGS. 9-10 to distinguish the effect that the enhancement layer 160 has on the formation of the extended bottom 162. As shown in FIGS. 9-10 the bottom 114 within the substrate 150 is located at the enhancement layer 160 and the material removal process extends the bottom 114 of the openings 110 deeper into the substrate 150 and the enhancement layer 160 in the vertical direction, and extends the sidewalls outward into the substrate 150 and the enhancement layer 160 in the horizontal direction at the bottom 114 of the openings 110 to create an extended bottom 162 within the openings 110

The processes described above produce various structures, such as that shown in FIGS. 7-10. Such structures include a substrate 100,150 having a horizontal surface 108 that runs in the horizontal direction. The substrate 100,150 may comprise an enhancement layer 160 (FIGS. 9-10) that runs in the horizontal direction, and a channel region 106 that is adjacent the horizontal surface. As shown in FIGS. 7-10, at least one pair of openings 110 extend into the substrate 100,150. The openings 110 are positioned on opposite sides of the channel region 106 of the substrate 100,150. The openings 110 each have a top 112 adjacent the horizontal surface, a bottom 114 within the substrate 100,150 (located at the enhancement layer in FIGS. 9-10) and sidewalls that run from the top 112 to the bottom 114.

The openings 110 run in the vertical direction from the top 112 to the bottom 114. The openings 110 include an extended bottom 122/162 extending the bottom 114 of the openings 110 deeper into the substrate 100 (and the enhancement layer in FIGS. 9-10) in the vertical direction. Further, the sidewalls extend outward into the substrate 100 (in the enhancement layer in FIGS. 9-10) in the horizontal direction at the bottom 114 of the openings 110.

As shown in FIGS. 7-10, a first strain producing material 124 is within the extended bottom 122 of the openings 110. A second material 130 is within the remainder of the openings 110 between the first strain producing material 124 and the top 112 of the openings 110. A gate dielectric 140 and a gate conductor 142 are on the horizontal surface on the substrate 100 adjacent the channel region 106. The second material 130 comprises source and drain regions and form a transistor with the channel region 106 and the gate conductor 142.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit the invention because, as would be understood by those ordinarily skilled in the art, the invention is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming an integrated circuit device, said method comprising:

forming a protective layer over a horizontal surface of a substrate, said horizontal surface running in a horizontal direction;

patterning at least one pair of openings through said protective layer and into said substrate, said openings each having a top adjacent said protective layer, a bottom within said substrate, and sidewalls running from said top to said bottom, said openings running in a vertical direction from said top to said bottom, said vertical direction being approximately perpendicular to said horizontal direction, said openings being positioned on opposite sides of a channel region of said substrate;

forming sidewall spacers along said sidewalls of said openings; performing a material removal process to remove additional substrate material from said bottom of said openings, said material removal process extending said bottom of said openings deeper into said substrate in said vertical direction and extending said sidewalls outward into said substrate in said horizontal direction at said bottom of said openings to create an extended bottom within said openings;

forming a first strain producing material within said extended bottom of said openings;

removing said sidewall spacers;

forming a second material within a remainder of said openings between said first strain producing material and said top of said openings;

removing said protective layer; and forming a gate dielectric and a gate conductor on said horizontal surface on said substrate adjacent said channel region, said second material comprising source and drain regions.

2. The method according to claim 1, said first strain producing material comprising oxide.

3. The method according to claim 1, said second material comprising germanium.

4. The method according to claim 1, said first strain producing material and said second material creating compressive stress within said channel region.

5. A method of forming an integrated circuit device, said method comprising:

forming a protective layer over a horizontal surface of a substrate, said horizontal surface running in a horizontal direction, and said substrate comprising an enhancement layer running in said horizontal direction;

patterning at least one pair of openings through said protective layer and into said substrate, said openings each having a top adjacent said protective layer, a bottom within said substrate located at said enhancement layer, and sidewalls running from said top to said bottom, said openings running in a vertical direction from said top to said bottom, said vertical direction being approximately perpendicular to said horizontal direction, said openings being positioned on opposite sides of a channel region of said substrate;

forming sidewall spacers along said sidewalls of said openings; performing a material removal process to remove additional substrate material from said bottom of said openings, said material removal process extending said bottom of said openings deeper into said substrate and said enhancement layer in said vertical direction and extending said sidewalls outward into said substrate and said enhancement layer in said horizontal direction at said bottom of said openings to create an extended bottom within said openings;

forming a first strain producing material within said extended bottom of said openings;

removing said sidewall spacers;

forming a second material within a remainder of said openings between said first strain producing material and said top of said openings;

removing said protective layer; and forming a gate dielectric and a gate conductor on said horizontal surface on said substrate adjacent said channel region, said second material comprising source and drain regions.

6. The method according to claim 5, said enhancement layer increasing a rate of at least one of:
said material removal process; and
said forming of said first strain producing material.

7. The method according to claim 5, said first strain producing material comprising oxide.

8. The method according to claim 5, said first strain producing material and said second material creating compressive stress within said channel region.

9. An integrated circuit device comprising:
a substrate having a horizontal surface running in a horizontal direction, said substrate comprising a channel region adjacent said horizontal surface;
at least one pair of openings extending into said substrate, said openings being positioned on opposite sides of said channel region of said substrate, said openings each having a top adjacent said horizontal surface, a bottom within said substrate, and sidewalls running from said top to said bottom, said openings running in a vertical direction from said top to said bottom, said vertical direction being approximately perpendicular to said horizontal direction, a first strain producing material within said bottom of said openings; said openings including an extended bottom extending said bottom of said openings deeper into said substrate in said vertical direction and extending said sidewalls outward into said substrate in said horizontal direction at said bottom of said openings;
a second material within a remainder of said openings between said first strain producing material and said top of said openings; and
a gate dielectric and a gate conductor on said horizontal surface on said substrate adjacent said channel region,
said second material comprising source and drain regions and forming a transistor with said channel region and said gate conductor.

10. The integrated circuit device according to claim 9, said first strain producing material comprising oxide.

11. The integrated circuit device according to claim 9, said second material comprising a conductor.

12. The integrated circuit device according to claim 9, said first strain producing material and said second material creating compressive stress within said channel region.

13. An integrated circuit device comprising:
a substrate having a horizontal surface running in a horizontal direction, said substrate comprising an enhancement layer running in said horizontal direction, and a channel region adjacent said horizontal surface;
at least one pair of openings extending into said substrate, said openings being positioned on opposite sides of said channel region of said substrate, said openings each having a top adjacent said horizontal surface, a bottom within said substrate located at said enhancement layer, and sidewalls running from said top to said bottom, said openings running in a vertical direction from said top to said bottom, said vertical direction being approximately perpendicular to said horizontal direction, said openings including an extended bottom extending said bottom of said openings deeper into said substrate and said enhancement layer in said vertical direction and extending said sidewalls outward into said substrate and said enhancement layer in said horizontal direction at said bottom of said openings;
a first strain producing material within said extended bottom of said openings;
a second material within a remainder of said openings between said first strain producing material and said top of said openings; and
a gate dielectric and a gate conductor on said horizontal surface on said substrate adjacent said channel region,
said second material comprising source and drain regions and forming a transistor with said channel region and said gate conductor.

14. The integrated circuit device according to claim 13, said enhancement layer increasing a rate of at least one of:
a material removal process used to remove additional substrate material from said bottom of said openings; and
a process of forming said first strain producing material.

15. The integrated circuit device according to claim 13, said first strain producing material comprising oxide.

16. The integrated circuit device according to claim 13, said second material comprising a conductor.

17. The integrated circuit device according to claim 13, said first strain producing material and said second material creating compressive stress within said channel region.

\* \* \* \* \*